(12) United States Patent
Srinivasan et al.

(10) Patent No.: US 10,386,411 B2
(45) Date of Patent: Aug. 20, 2019

(54) SEQUENTIAL TEST ACCESS PORT SELECTION IN A JTAG INTERFACE

(71) Applicant: STMicroelectronics International N.V., Schiphol (NL)

(72) Inventors: Venkata Narayanan Srinivasan, Gautam Budh Nagar District (IN); Manish Sharma, Gurgaon (IN)

(73) Assignee: STMicroelectronics International N.V., Schiphol (NL)

( * ) Notice: Subject to any disclaimer, the term of this patent is extended or adjusted under 35 U.S.C. 154(b) by 55 days.

(21) Appl. No.: 15/684,334

(22) Filed: Aug. 23, 2017

(65) Prior Publication Data

US 2019/0064271 A1    Feb. 28, 2019

(51) Int. Cl.
*G01R 31/317*     (2006.01)
*G01R 31/3185*    (2006.01)

(52) U.S. Cl.
CPC .............. *G01R 31/31705* (2013.01); *G01R 31/318597* (2013.01)

(58) Field of Classification Search
CPC ............. G01R 31/31705; G01R 31/318597
See application file for complete search history.

(56) References Cited

U.S. PATENT DOCUMENTS

| | | | | |
|---|---|---|---|---|
| 5,459,737 A * | 10/1995 | Andrews | ............ | G01R 31/3004 714/721 |
| 6,530,047 B1 * | 3/2003 | Edwards | .......... | G01R 31/31903 709/224 |
| 6,591,369 B1 * | 7/2003 | Edwards | .......... | G01R 31/31903 327/39 |
| 6,601,189 B1 * | 7/2003 | Edwards | .......... | G01R 31/31903 710/106 |
| 6,665,816 B1 * | 12/2003 | Edwards | ........ | G01R 31/318533 710/50 |
| 6,779,145 B1 * | 8/2004 | Edwards | ............. | G06F 11/3636 324/73.1 |
| 2003/0056154 A1 * | 3/2003 | Edwards | ................. | G06F 11/25 714/45 |
| 2005/0166105 A1 * | 7/2005 | Warren | .......... | G01R 31/318536 714/724 |
| 2005/0166106 A1 * | 7/2005 | Warren | .......... | G01R 31/318536 714/724 |
| 2005/0216802 A1 * | 9/2005 | Warren | .......... | G01R 31/318536 714/724 |
| 2007/0038433 A1 * | 2/2007 | Swoboda | ............ | G06F 11/3656 703/23 |

(Continued)

*Primary Examiner* — Joseph D Torres
(74) *Attorney, Agent, or Firm* — Crowe & Dunlevy

(57) ABSTRACT

A JTAG interface in an IC includes a test mode select (TMS) pin receiving a TMS signal, a testing test access port (TAP) having a TMS signal input, a debugging test access port (TAP) having a TMS signal and glue logic coupled to receive a first output from the testing TAP and a second output from the debugging TAP. A flip-flop receives input from the testing TAP and the debugging TAP through the glue logic. A first AND gate has output coupled to the TMS signal input of the debugging TAP, and receives input from an output of the flip-flop and the TMS signal. An inverter has an input coupled to receive input from the flip-flop. A second AND gate has output coupled to the TMS signal input of the testing TAP, and receives input from the TMS signal and output of the inverter.

12 Claims, 3 Drawing Sheets

(56) References Cited

U.S. PATENT DOCUMENTS

| | | | | |
|---|---|---|---|---|
| 2009/0013226 A1* | 1/2009 | Swoboda | ....... | G01R 31/318536 |
| | | | | 714/726 |
| 2015/0067425 A1* | 3/2015 | Kim | ............... | G01R 31/318555 |
| | | | | 714/727 |
| 2018/0284192 A1* | 10/2018 | Kumar | ........... | G01R 31/318597 |
| 2019/0064270 A1* | 2/2019 | Srinivasan | ..... | G01R 31/318533 |

* cited by examiner

SEQUENTIAL TEST ACCESS PORT SELECTION IN A JTAG INTERFACE

TECHNICAL FIELD

This disclosure is related to the field of the Joint Test Action Group (JTAG) testing or interfaces, as per the IEEE 1149.1 standard, and, in particular, to device specific functionality that complies with this standard yet reduces the number of pins used.

BACKGROUND

JTAG is the name used for the IEEE 1149.1 standard entitled Standard Test Access Port and Boundary-Scan Architecture for test access ports (TAP) used for testing printed circuit boards (PCB) and microprocessors. The acronym JTAG stands for the Joint Test Action Group, the name of the organization of individuals that developed the IEEE 1149.1 standard.

The functionality offered by JTAG is that of providing debug access and boundary scan testing to and of PCBs and microprocessors. Debug Access is used by debugger tools to access the internals of a chip, thereby making its resources and functionality available and modifiable, e.g. registers, memories and the system state. Thus, debug access may be used to test the functioning of the chip itself. Boundary Scan testing is used by hardware test tools to test the physical connection of a chip to other devices on a printed circuit board (PCB). Thus, boundary scan testing may be used to test for proper electrical connections between the chip and other devices.

The debug function may in some cases utilize one TAP, while the boundary scan function utilizes another TAP. However, this may necessitate the use of an extra pin above the minimum required by the JTAG standard, which may be undesirable in some scenarios.

In some instances, both a boundary scan functional TAP and a debug functional TAP can be connected in series. However, this may result in increased latency during boundary scan testing, which may be undesirable.

Therefore, further development in hardware implementing JTAG interfaces is needed.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

Disclosed herein is circuitry for coupling test access port (TAP) signals to a Joint Test Action Group (JTAG) interface in an integrated circuit package. The circuitry includes a TMS pin configured to receive a test mode select signal, a testing test access port (TAP) having a test mode select signal input, a debugging test access port (TAP) having a test mode select signal input and glue logic coupled to receive a first output from the testing TAP and a second output from the debugging TAP. A flip flop receives input from the testing TAP and the debugging TAP through the glue logic, which performs TAP controller operations of the selected tap (whether it be debug or test) to load the flip flop with the opposite value to select the other tap. A first AND gate has an output coupled to the test mode select signal input of the debugging TAP, and receives input from an output of the flip flop and the test mode select signal. An inverter has an input coupled to receive input from the flip flop. A second AND gate has an output coupled to the test mode select signal input of the testing TAP, and receives input from the test mode select signal and an output of the inverter.

The glue logic (when performing the test TAP controller operations) may load the flip flop with a first logic value when the debugging TAP is to be selected.

The first logic value may be a logic 1. The glue logic (when performing the test TAP controller operations) loading the flip flop with the logic 1 causes the debugging TAP to be selected whose operations are then controlled by the test mode select signal.

The glue logic loading the flip flop with the logic 1 also results in the testing TAP being placed into a deselected state.

The deselected state may place the testing TAP in a runtestidle state.

The glue logic (when performing the debug TAP controller operations) may load the flip flop with a second logic value different than the first logic value when the testing TAP is to be selected.

The second logic value may be a logic 0. The glue logic (when performing the debug TAP controller operations) loading the flip flop with the logic 0 causes selection of the test TAP whose operations are then controlled from the test mode select signal.

The glue logic (when performing debug TAP controller operations) loading the flip flop with the logic 0 also results in the debugging TAP being placed into a deselected state.

The deselected state may be a runtestidle state.

Upon power-up or reset of the circuitry, the flip flop is reset with the second logic value.

The JTAG interface consists may be interface meeting IEEE Standard 1149.1-2013, entitled Standard Test Access Port and Boundary-Scan Architecture.

Also disclosed herein is circuitry for coupling test access port (TAP) signals to a Joint Test Action Group (JTAG) interface in an integrated circuit package. This circuitry includes a TMS pin to receive a test mode select signal, a testing test access port (TAP) having a test mode select signal input, and a debugging test access port (TAP) having a test mode select signal input Glue logic is coupled to receive output from the testing TAP and the debugging TAP. A first flip flop receives input from the debugging TAP through the glue logic. A second flip flop receives input from the testing TAP through the glue logic. The glue logic performs debug TAP controller operations if selected to load the first flip flop with the opposite value to select the test TAP, or performs test TAP controller operations if selected to load the second flip flop with the opposite value to select the debug TAP. A XOR gate receives input from the first and second flip flops. A first AND gate has an output coupled to the test mode select signal input of the debugging TAP, and receives input from the XOR gate and the test mode select signal. An inverter has an input coupled to receive input from the XOR gate. A second AND gate has an output coupled to the test mode select signal input of the testing TAP, and receives input from the test mode select signal and the inverter.

The first flip flop remains with a second logic value (when the debug TAP in run test idle state) and the glue logic (performing test TAP controller operations) may load the second flip flop with a first logic value different than the second logic value when the debugging TAP is to be selected.

The first logic value may be a logic 1. The second logic value may be a logic 0. The first flip being loaded with the logic 0 and the and glue logic (performing test TAP controller operations) loading the second flip flop with the logic 1 may result in the testing TAP being placed into a deselected state. The deselected state may be a runtestidle state.

The glue logic (performing debug TAP controller operations) may load the first flip flop with a first logic value and second flip flop remains with the first logic value (with the test TAP in runtestidle) when the testing TAP is to be selected.

The first logic value may be a logic 1. The glue logic (performing debug TAP controller operations) loading the first flip flop with the logic 1 with second flip flop remaining in logic 1 (with the test tap in runtestidle) may result in the debugging TAP being placed into a deselected state. The deselected state may be a runtestidle state.

The first flip flop remains with a first logic value (with the debug TAP in runtestidle) and the glue logic (performing test TAP controller operations) may load the second flip flop with a second logic value different than the first logic value when the debugging TAP is to be selected.

The first logic value may be a logic 1, and the second logic value may be a logic 0. The first flip loaded with the logic 1 (with the debug TAP in runtestidle) and the glue logic (performing test TAP controller operations) loading the second flip flop with the logic 0 may result in the testing TAP being placed into a deselected state. The deselected state may be a runtestidle state.

Upon power-up or reset of the circuitry, both the flip flops are reset with the second logic value.

DETAILED DESCRIPTION

One or more embodiments of the present disclosure will be described below. These described embodiments are only examples of the presently disclosed techniques. Additionally, in an effort to provide a concise description, some features of an actual implementation may not be described in the specification. When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements.

JTAG is a hardware interface that provides a way for a debug tool to communicate directly with a system on a chip, a core of a system on a chip, a microprocessor, or a core of a microprocessor on a printed circuit board (PCB). As explained, JTAG is codified as IEEE 1149.1, the contents of which are hereby incorporated by reference in their entirety.

Figure 1:
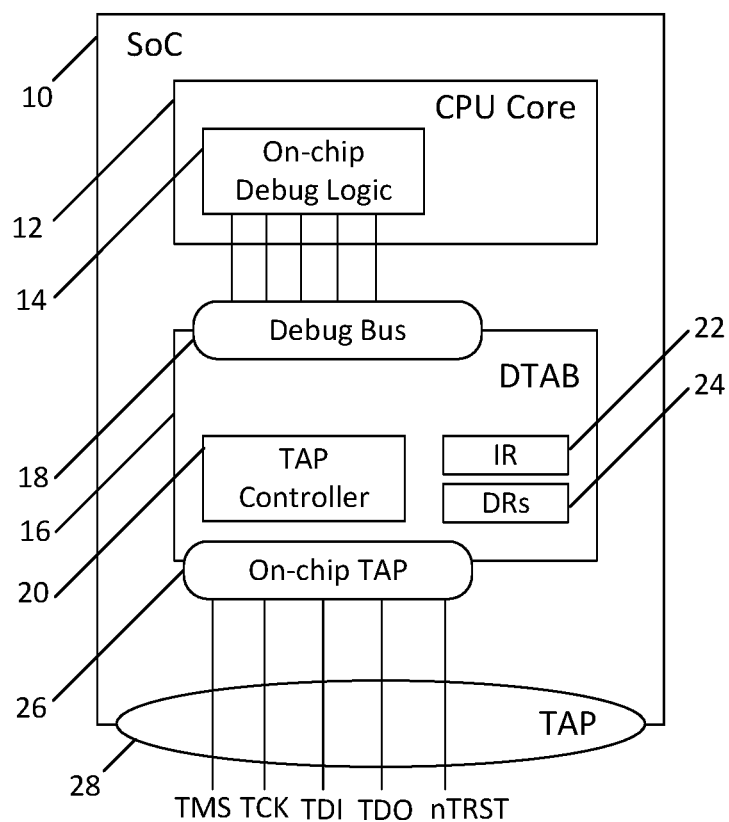
FIG. 1 is a schematic block diagram of a generic JTAG TAP.

Shown in FIG. 1 is a system on a chip (SoC) 10 including a debug and test access block (DTAB) 16 implementing generic JTAG functionality. The SoC 10 includes a central processing unit core 12, which itself has integrated therein on-chip debugging logic 14. The on-chip debugging logic 14 communicates with the DTAB 16 via a debug bus 18 associated with the DTAB 16. The DTAB 16 includes a TAP controller 20, such as a state machine, that interacts with an instruction register (IR) 22 and data registers (DRs) 24. The DTAB 16 provides an on-chip TAP 26 that is ultimately connected to the TAP 28 for the SoC 10.

As per IEEE 1149.1, the TAP 28 has five pins, each configured to receive or provide a specific signal. The pins and their associated signals are:

1. TCK, which receives the test clock signal. The TCK signal is the clock of, and dictates the speed of operation of, the TAP 20 controller. On every assertion of the test clock signal TCK, the TAP controller 20 takes a single action. The actual clock speed is not specified in the IEEE 1149.1 standard, but rather the TAP controller 20 is clocked according to the received test signal clock TCK.

2. TMS, which receives the test mode select signal. The TMS signal controls the specific actions taken by the TAP controller 20.

3. TDI, which receives the test data-in signal that feeds data to the SoC 10. The IEEE 1149.1 standard does not define protocols for communication over this pin. Those specifics are application dependent and may be defined by device manufacturers.

4. TDO, which receives the test data-out signal that provides output from the SoC 10. Like the TDI signal, the IEEE 1149.1 standard does not define protocols for communications over the TDO pin. Likewise, those specifics are application dependent and may be defined by device manufacturers.

5. nTRST, which receives the test reset signal. The nTRST signal is used to reset the JTAG to a known good state. This nTRST pin is optional as per the IEEE 1149.1 standard, and device manufacturers may decide whether or not to include it.

The TMS and TDI signals are sampled by the DTAB 16 on each rising edge of the TCK signal. The TDO signal outputs its value at each falling edge of TCK signal.

The functionality of the DTAB 16 is accessible via different instructions loaded into the IR 22. By loading an instruction into the IR 22, the corresponding DR 24 is selected for access, to thereby provide and/or accept data according to the selected instruction.

Certain instructions are defined by the IEEE 1149.1 standard. These instructions include the BYPASS instruction for use in daisy-chained configurations where TAPs of more than one chip or core are connected in series, and the IDCODE instruction for identifying a specific device.

The TAP controller 20 is a state machine defined by the IEEE 1149.1 standard. Each state of the TAP controller 20 can be reached by a sequence of bits transmitted via the TMS signal, and is dependent on the current state.

The following states of the TAP controller are of interest:

1. Test Logic Reset sets the IR 22 to its reset value (IDCODE or BYPASS). This state can be reached from any other state by shifting five times a logic "1" value on the TMS.

2. Run-Test/Idle and Select DR-Scan are used by debuggers as a pause parking position.

3. In the Shift-IR state, the debug tool shifts an instruction into the IR 22. The instruction is activated once the TAP controller 20 reaches the Update-IR state.
4. In the Shift-DR state, the debug tool shifts data to/from the DR 24 selected by the currently loaded instruction.

As explained, in some designs, separate TAPs may be used for boundary scan test and for debug. Known designs for utilizing separate taps involve the addition of a separate TAPSELECT pin. This represents the adding of an additional pin to a package, which may be undesirable, since such a pin could either be eliminated, or could instead be repurposed as a general purpose input/output pin.

Therefore, the Inventors have devised new circuitry to implement tap selection in a sequential manner, without the addition of an additional pin, and without the usage of the optional nTRST pin.

Figure 2:
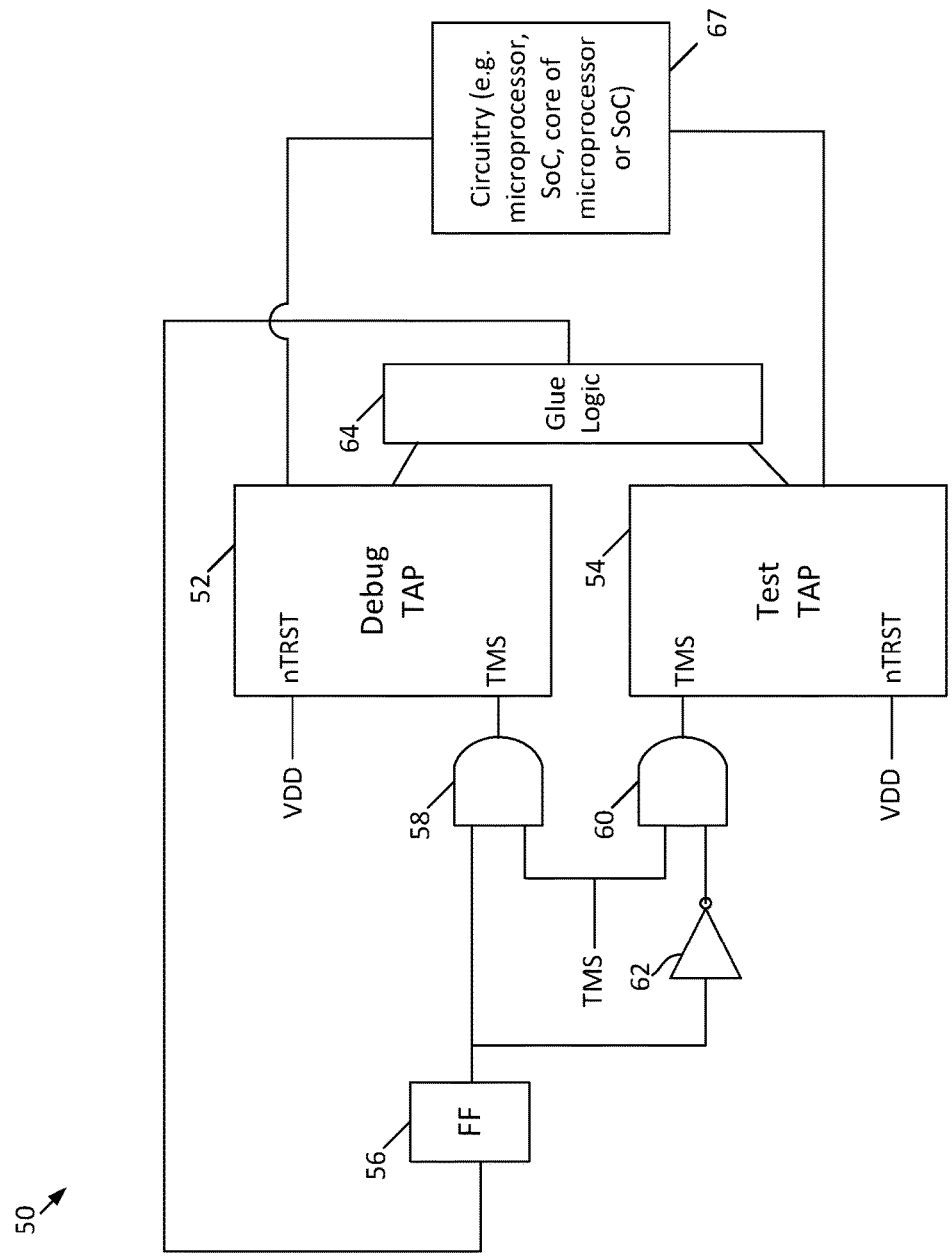
FIG. 2 is a schematic block diagram of a circuit permitting selection between a test (boundary scan) TAP and a debug TAP in a sequential fashion, utilizing a flip flop for selection instead of using an additional tap select pin or a test reset pin, in accordance with this disclosure.

One such design is now described with respect to FIG. 2. Here, the debug TAP 52 and test TAP 54 access circuitry 67 (e.g. a core of a system on a chip, a microprocessor, or core of a microprocessor) in parallel. Since the boundary scan test and debug mode may not be performed simultaneously, the associated logic circuitry 50 selects which of the debug TAP 52 and test TAP 54 to couple to the circuitry 67, through glue logic 64, which performs TAP controller operations for the selected tap (debug or test), and loads the flip flop 56 with the opposite value to select the other tap thereafter. It is noted that an output of the glue logic 64 is coupled to the input of the flip flop 56.

In greater detail, the debug TAP 52 has, among its other terminals, a nTRST terminal and a TMS terminal. AND gate 58 has its output coupled to the TMS terminal of the debug TAP 52, and receives as input the TMS signal from the chip TMS pin and the output from the flip flop 56. The nTRST terminal is coupled to VDD.

The test TAP 54 has, among its other terminals, a nTRST terminals and a TMS terminal. The AND gate 60 has its output coupled to the TMS terminal of the test TAP 54, and receives as input the TMS signal from the chip TMS pin and an inverted version of the output from flip flop 56 generated by inverter 62. This nTRST pin is also coupled to VDD.

It is noted here that the nTRST terminals of the debug tap 52 and test tap 54 are unused, and thus the debug tool used with the circuit 50 need not have an nTRST chip pin. In operation, at power-up or reset, the flip flop 56 defaults to holding a logic zero, resulting in the flip flop 56 outputting the logic zero. This results in the selection of the test tap 54 due to the logic high at inverter output 62, the TMS signal being output by AND gate 60, and the deselection of the debug tap 52 due to the logic low that would be output by AND gate 58. This deselection would serve to maintain the debug tap 52 in the Run-Test/Idle state.

To select the debug TAP 52, the test TAP 54 through the glue logic 64 outputs a logic one to the flip flop 56, where the glue logic 64 performs the test TAP controller operations to select and load logic one to the flip flop 56. This results in the selection of debug TAP 52 due to the logic high TMS signal would be output by AND gate 58, and the deselection of the test TAP 54 due to the logic low that would be output by AND gate 60. This deselection would serve to maintain the test TAP 54 in the Run-Test/Idle state.

To select the test TAP 54 after the debug TAP 52 has been selected, the debug TAP 52 through the glue logic 64 outputs a logic zero to the flip flop 56, where the glue logic 64 performs the debug TAP controller operations to select and load a logic zero to the flip flop 56. This would result in the selection of the test tap 54 due to the logic high at inverter output 62, the output of the TMS signal by AND gate 60, and the deselection of the debug tap 52 due to the logic low that would be output by AND gate 58. This deselection would serve to maintain the debug tap 52 in the Run-Test/Idle state.

Figure 3:
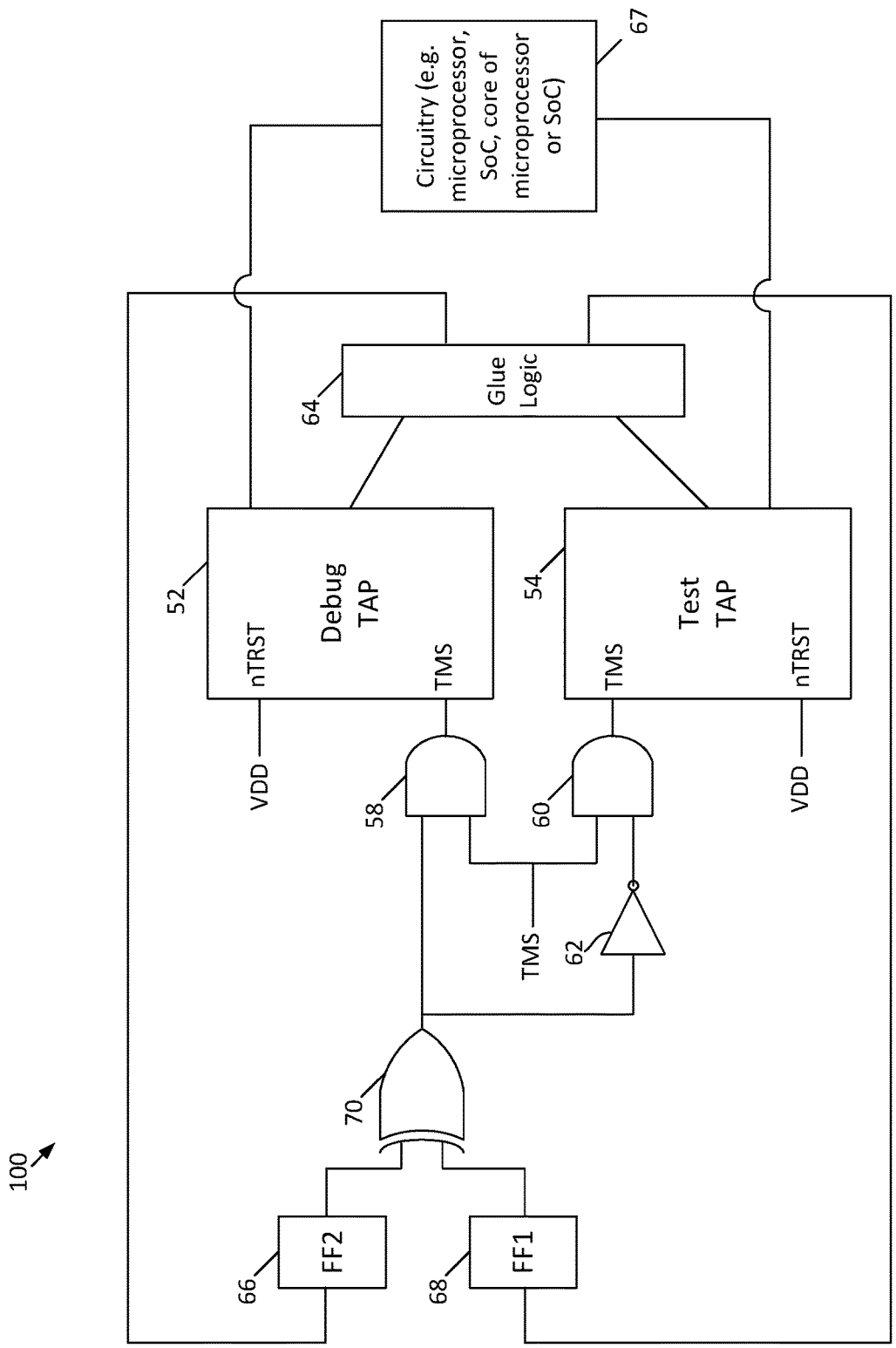
FIG. 3 is a schematic block diagram of a circuit permitting selection between a test (boundary scan) TAP and a debug TAP in a sequential fashion, utilizing two flip flops for selection instead of using an additional tap select pin or a test reset pin, in accordance with this disclosure.

Another embodiment of circuitry to implement tap selection in a sequential manner, without the addition of an additional pin, and without the usage of the optional nTRST pin is now described with reference to FIG. 3.

Here, the debug TAP 52 and test TAP 54 access the circuitry 67 in parallel. Since the boundary scan test and debug mode may not be performed simultaneously, the associated circuitry 100 selects which of the debug TAP 52 and test TAP 54 to couple to the circuitry 67 through glue logic 64. The glue logic 64 performs test TAP controller operations if selected to load the first flip flop 68 to select debug TAP 52 or debug TAP controller operations if selected to load the second flip flop 66 to select the test TAP 54. It is noted that the glue logic 64 is coupled to the input of the flip flops 66 and 68.

In greater detail, the debug TAP 52 has, among its other terminals, a nTRST terminals and a TMS terminal. The AND gate 58 has its output coupled to the TMS terminal of the debug TAP 52, and receives as input the TMS signal from the chip TMS pin and the output from the exclusive OR gate 70. The nTRST terminal is coupled to VDD.

The test TAP 54 has, among its other terminals, a nTRST terminal and a TMS terminal. AND gate 60 has its output coupled to the TMS terminal of the test TAP 54, and receives as input the TMS signal and an inverted version of the output from the exclusive OR gate 70. The nTRST terminal is coupled to VDD.

Flip flops 66 and 68 receive input from the glue logic 64 where glue logic 64 through the test TAP operations loads the first flop flop 68 with an opposite value to select the debug TAP 52 if debug operations are to be performed, or through the debug TAP operations loads the second flip flop 66 with an opposite value to select the test TAP 54. If test operations are to be performed The exclusive OR gate 70 receives input from the flip flops 66 and 68.

It is noted here that the nTRST terminals of the debug tap 52 and test tap 54 are unused, and thus the debug tool used with the circuit 100 need not have a nTRST chip pin. In operation, at power-up or reset, the flip flops 66 and 68 default to holding a logic zero, resulting in the flip flops 66 and 68 outputting logic zeros. This results in the exclusive OR gate 70 outputting a logic zero. This would result in the selection of the test tap 54 due to the logic high at inverter output 62, the TMS signal being output by AND gate 60, and the deselection of the debug tap 52 due to the logic low that would be output by AND gate 58. This deselection would serve to maintain the debug tap 52 in the Run-Test/Idle state.

To select the debug TAP 52, the test TAP 54 through the glue logic 64 (performing test TAP controller operations) outputs a logic one to the flip flop 68, and the flip flop 66 will remain with a logic zero as debug tap 52 is in the Run-Test/Idle state. This results in the exclusive OR gate 70 outputting a logic one. This results in the selection of debug TAP 52 due to the logic high TMS signal that would be output by AND gate 58, and the deselection of the test TAP 54 due to the logic low that would be output by AND gate 60. This deselection would serve to maintain the test TAP 54 in the Run-Test/Idle state.

To select the test TAP 54 after the debug TAP 52 has been selected, the debug TAP 52 through the glue logic 64 (performing debug TAP controller operations) 64 outputs a logic one to the flip flop 66, and the flip flop 68 will remain with the logic one as test tap 54 is in the Run-Test/Idle state. This results in the exclusive OR gate 70 outputting a logic zero. This would result in the selection of the test tap 54 due to the logic high at inverter output 62, the TMS signal that would be output by AND gate 60, and the deselection of the debug tap 52 due to the logic low that would be output by AND gate 58. This deselection would serve to maintain the debug tap 52 in the Run-Test/Idle state.

To select the debug TAP 52 after the test TAP 54 has been selected, the test TAP 54 through the glue logic 64 (performing test TAP controller operations) outputs a logic zero to the flip flop 68, and the flip flop 66 will remain with a logic one as the debug tap 52 is in the Run-Test/Idle state. This results in the exclusive OR gate 70 outputting a logic one. This results in the selection of debug TAP 52 due to the logic high TMS signal that would be output by AND gate 58, and the deselection of the test TAP 54 due to the logic low that would be output by AND gate 60. This deselection would serve to maintain the test TAP 54 in the Run-Test/Idle state.

These circuits 50 and 100 provide for a way to select between the debug TAP 52 and test TAP 54, without the addition of a TAPSEL pin, in devices where the nTRST signal is to remain unused. The pin that would otherwise have been the TAPSEL pin can either then be eliminated, or used as a general purpose input/output pin. Likewise, the pin that would otherwise have been the nTRST pin can either then be eliminated, or used as a general purpose input/output pin.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. Circuitry for coupling test access port (TAP) signals to a Joint Test Action Group (JTAG) interface in an integrated circuit package, the circuitry comprising:
   a TMS pin to receive a test mode select signal;
   a testing test access port (TAP) having a test mode select signal input;
   a debugging test access port (TAP) having a test mode select signal input;
   glue logic coupled to receive output from the testing TAP and the debugging TAP;
   a first flip flop receiving input from the debugging TAP through the glue logic;
   a second flip flop receiving input from the testing TAP through the glue logic;
   a XOR gate receiving input from the first and second flip flops;
   a first AND gate having an output coupled to the test mode select signal input of the debugging TAP, and receiving input from the XOR gate and the test mode select signal;
   an inverter having an input coupled to receive input from the XOR gate;
   a second AND gate having an output coupled to the test mode select signal input of the testing TAP, and receiving input from the test mode select signal and the inverter.

2. The circuitry of claim 1, wherein the first flip flop remains at a second logic value and the glue logic loads the second flip flop with a first logic value different than the second logic value when the debugging TAP is to be selected.

3. The circuitry of claim 2, wherein the first logic value is a logic 1; wherein the second logic value is a logic 0; and wherein the first flip is loaded with the logic 0 and the glue logic loading the second flip flop with the logic 1 results in the testing TAP being placed into a deselected state.

4. The circuitry of claim 3, wherein the deselected state is a runtestidle state.

5. The circuitry of claim 2, wherein, upon power-up or reset of the circuitry, both the first and second flip flops are reset with the second logic value.

6. The circuitry of claim 1, wherein the glue logic loads the first flip flop with a first logic value and the second flip flop remains at the first logic value when the testing TAP is to be selected.

7. The circuitry of claim 6, wherein the first logic value is a logic 1; and wherein the glue logic loading the first flip flop with the logic 1 with second flip flop remaining at a logic 1 results in the debugging TAP being placed into a deselected state.

8. The circuitry of claim 7, wherein the deselected state is a runtestidle state.

9. The circuitry of claim 1, wherein the first flip flop remains with a first logic value and the glue logic loads the second flip flop with a second logic value different than the first logic value when the debugging TAP is to be selected.

10. The circuitry of claim 9, wherein the first logic value is a logic 1; wherein the second logic value is a logic 0; and wherein the first flip being loaded with the logic 1 and the glue logic loading second flip flop with the logic 0 results in the testing TAP being placed into a deselected state.

11. The circuitry of claim 10, wherein the deselected state is a runtestidle state.

12. The circuitry of claim 1, wherein the JTAG interface consists of an interface meeting IEEE Standard 1149.1-2013, entitled Standard Test Access Port and Boundary-Scan Architecture; wherein the test mode select signal consists of a TMS signal according to the IEEE Standard 1149.1-2013; wherein the testing TAP consists of a testing TAP according to IEEE Standard 1149.1-2013; and wherein the debugging TAP consists of a debugging TAP according to IEEE Standard 1149.1-2013.

* * * * *